United States Patent
Bodette et al.

(10) Patent No.: US 10,537,048 B2
(45) Date of Patent: Jan. 14, 2020

(54) SYSTEMS AND METHODS FOR PREVENTING LEAKAGE OF ELECTROMAGNETIC WAVES FROM ELECTRONIC DEVICES

(71) Applicant: Lenovo Enterprise Solutions (Singapore) Pte. Ltd., New Tech Park (SG)

(72) Inventors: Edward James Bodette, Raleigh, NC (US); Michael Harley Crowder, Raleigh, NC (US); Kevin Perveiler, Raleigh, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 0 days.

(21) Appl. No.: 15/935,101

(22) Filed: Mar. 26, 2018

(65) Prior Publication Data
US 2019/0297755 A1   Sep. 26, 2019

(51) Int. Cl.
*H05K 9/00* (2006.01)

(52) U.S. Cl.
CPC ........... *H05K 9/0009* (2013.01); *H05K 9/009* (2013.01); *H05K 9/0016* (2013.01); *H05K 9/0083* (2013.01); *H05K 9/0088* (2013.01)

(58) Field of Classification Search
USPC .................................................. 361/816, 818
See application file for complete search history.

(56) References Cited

U.S. PATENT DOCUMENTS

| | | | | |
|---|---|---|---|---|
| 5,045,635 A * | 9/1991 | Kaplo | .......................... | H02B 1/16 174/354 |
| 5,256,833 A * | 10/1993 | Schwenk | .............. | H05K 9/0016 174/363 |
| 5,603,514 A * | 2/1997 | Jencks | .................. | H05K 9/0015 174/358 |
| 5,889,229 A * | 3/1999 | Sosnowski | ............. | D04B 1/225 174/357 |
| 6,613,976 B1 * | 9/2003 | Benn, Jr. | ............... | H05K 9/0015 174/358 |
| 7,470,866 B2 * | 12/2008 | Dietrich | ............... | H05K 9/0015 174/356 |
| 8,157,593 B1 * | 4/2012 | Sim | ........................ | H01R 13/74 439/607.28 |
| 2007/0083289 A1 * | 4/2007 | Russell | .............. | G05B 19/4207 700/245 |
| 2009/0114438 A1 * | 5/2009 | van Haaster | ......... | H05K 9/0015 174/356 |

\* cited by examiner

*Primary Examiner* — Hung S. Bui
(74) *Attorney, Agent, or Firm* — Olive Law Group, PLLC (57) ABSTRACT

Systems and methods for preventing leakage of electromagnetic waves from electronic devices, or for preventing unwanted RF fields from entering an electronic device. According to an aspect, a system includes a body and a cover positioned to define an enclosed interior space for placement of an electronic device. The system also includes a gasket attached to or integrated one of the body and cover to seal the interior space from outside the electronic device enclosure. Further, the system includes an electromagnetic wave absorptive material attached to a portion of the gasket for absorbing electromagnetic waves generated within or outside of the electronic device enclosure.

16 Claims, 6 Drawing Sheets

```
┌─────────────────────────────────────────────────────────┐
│  PROVIDE AN ELECTRONIC DEVICE ENCLOSURE COMPRISING A    │
│         BODY AND A COVER POSITIONED TO                  │
│         DEFINE AN ENCLOSED INTERIOR SPACE               │
│      FOR PLACEMENT OF AN ELECTRONIC DEVICE              │
│                         200                             │
└─────────────────────────────────────────────────────────┘
                            │
                            ▼
┌─────────────────────────────────────────────────────────┐
│     PROVIDE A GASKET ATTACHED TO OR INTEGRATED          │
│            WITH ONE OF THE BODY AND                     │
│   COVER TO SEAL THE INTERIOR SPACE FROM OUTSIDE THE     │
│            ELECTRONIC DEVICE ENCLOSURE                  │
│                         202                             │
└─────────────────────────────────────────────────────────┘
                            │
                            ▼
┌─────────────────────────────────────────────────────────┐
│   APPLY AN ELECTROMAGNETIC WAVE ABSORPTIVE MATERIAL     │
│      TO A PORTION OF THE GASKET FOR ABSORBING           │
│  ELECTROMAGNETIC WAVES GENERATED WITHIN OR OUTSIDE      │
│           THE ELECTRONIC DEVICE ENCLOSURE               │
│                         204                             │
└─────────────────────────────────────────────────────────┘
```

SYSTEMS AND METHODS FOR PREVENTING LEAKAGE OF ELECTROMAGNETIC WAVES FROM ELECTRONIC DEVICES

TECHNICAL FIELD

The presently disclosed subject matter relates to electronic devices. More particularly, the presently disclosed subject matter relates to systems and methods for preventing leakage of electromagnetic waves from electronic devices, and for improving immunity of the electronic device from interference from external electromagnetic noise sources.

BACKGROUND

Electromagnetic waves, particularly within the radio frequency (RF) range, are generated by electronic device components. Such electronic devices typically provide a housing for their components. The electromagnetic waves can undesirably leak from the seams or junctions of the housing. This is not ideal because such leakage can adversely affect the performance of other nearby electronic devices and can adversely affect their ability to meet international emissions standards. In addition, excessive leakage of electromagnetic waves in the RF range from intentional radiators such as cell phones may become a health concern when there is a prolonged exposure to and use of these electronic devices.

Current common techniques to prevent the escape of RF emissions include installation of metal finger stocks or purely conductive foam gaskets at enclosure junction points of the electronic devices. However, gaps between the metal finger stock and a mating surface on the electronic devices can exacerbate the RF leakage because the physical slot between individual fingers becomes an aperture through which RF noise can escape. An alternative is to use purely conductive foam gaskets to eliminate the gaps between the metal fingers. However, purely conductive foam gaskets have less conductivity than metal fingers limiting their effectiveness, and often experience problems related to a compression set of the foam, which reduces contact pressure over time. That is, current techniques typically use conductive finger stocks or gaskets to prevent the escape of RF emissions, which is not a tenable solution.

As such, other solutions are needed to better prevent the escape of RF emissions or other electromagnetic emissions from enclosure seal or junction points of the electronic devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Disclosed herein are systems and methods for preventing leakage of electromagnetic waves from electronic devices. According to an aspect, a system includes a body and a cover positioned to define an enclosed interior space for placement of an electronic device. The system also includes a gasket attached to or integrated one of the body and cover to seal the interior space from outside the electronic device enclosure. Further, the system includes an electromagnetic wave absorptive material attached to a portion of the gasket for absorbing electromagnetic waves generated within or outside of the electronic device enclosure.

BRIEF DESCRIPTION OF THE DRAWINGS

The foregoing summary, as well as the following detailed description of various embodiments, is better understood when read in conjunction with the appended drawings. For the purposes of illustration, there is shown in the drawings example embodiments; however, the presently disclosed subject matter is not limited to the specific methods and instrumentalities disclosed. In the drawings.

DETAILED DESCRIPTION

The presently disclosed subject matter is described with specificity to meet statutory requirements. However, the description itself is not intended to limit the scope of this patent. Rather, the inventors have contemplated that the claimed subject matter might also be embodied in other ways, to include different steps or elements similar to the ones described in this document, in conjunction with other present or future technologies.

As referred to herein, the term "electronic device" should be broadly construed. It can include a server, a computing device, as subsequently defined, or any other such suitable device. It can include items such as network devices, household appliances, audio visual equipment, cell phones, radio equipment, laptop computers, any device that has a microprocessor or internal clock circuit, any device that generates electromagnetic emissions, or any device susceptible to interference from electromagnetic emissions. An electronic device can include any suitable device with seams or enclosure junction points and a plurality of conductive surface which can operably mate. An electronic device may be contained within an enclosed interior space defined by a body and a cover when closed together. The cover may be opened for access to electronic components and cables within the electronic device. Example components in the case of computing device hardware includes processors, integrated chips (ICs), memory, input/output devices, and buses. An electronic device may be a type of network device such as a router or a network switch. In more general terms, any device with a microprocessor, internal clock circuit, or any other circuit that generates a time varying current will generate electromagnetic waves, so other example devices include items such as common household appliances, cell phones, televisions, audio/video components, computer monitors, peripherals, and radio devices.

FIGS. 1A-1D are perspective views of various example gaskets 100, 102, 104, and 106 for preventing leakage of electromagnetic waves from electronic devices in accordance with the embodiments. The figures only show a portion of the gaskets 100, 102, 104, and 106, but the gaskets may be extend substantially in the directions indicated by double arrow 108. Either gasket 100, 102, 104, and 106 may be attached to either a body or cover to seal an interior space of an electronic device to seal the interior space from outside the body and cover when the body and cover are closed together. The interior space may include an electronic device or at least some of its components. An electromagnetic wave absorptive material 112 may be applied to a portion of the gasket 100, 102, 104, and 106 for absorbing electromagnetic waves generated within the interior space. In these examples, an electromagnetic wave absorptive material may be applied to all or a portion of surfaces 110 of the gaskets 100, 102, 104, and 106. In this example, a layer of electromagnetic wave absorptive material is applied to only the portions designated 112. Example electromagnetic wave absorptive material include, but are not limited to, carbon impregnated foam, an epoxy loaded with carbon, a polymer resin with a metal flake filler, the like, and combinations thereof. An example of the electromagnetic wave absorptive material can include iron or other suitable ferrous flakes. Another example of an RF absorptive material can be any base material, such as a foam or resin, that is embedded with a material that can absorb RF, such as carbon, metal flakes, or other such suitable materials. The material can be configured specifically for absorbing RF waves.

Various sized and shaped gaskets are shown in FIGS. 1A-1D. However, any suitably sized and shaped gasket of any suitable material may be utilized in accordance with the subject application. Example gaskets include, but are not limited to, dome clips, finger clips, finger stocks, and the like. A gasket can be made of, for example, beryllium copper, stainless steel, or any other suitably material, such as a conductive material. Metal spring fingers may also be formed directly into the sheet metal enclosure material, serving the same purpose as a separate EMC gasket. RF material may also be similarly applied to these fingers in the same way.

Figure 1A:
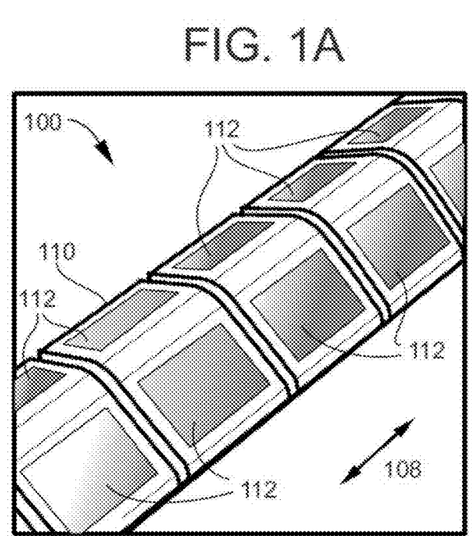
FIGS. 1A-1D are perspective views of various example gaskets in accordance with embodiments of the present disclosure.
Figure 1B:
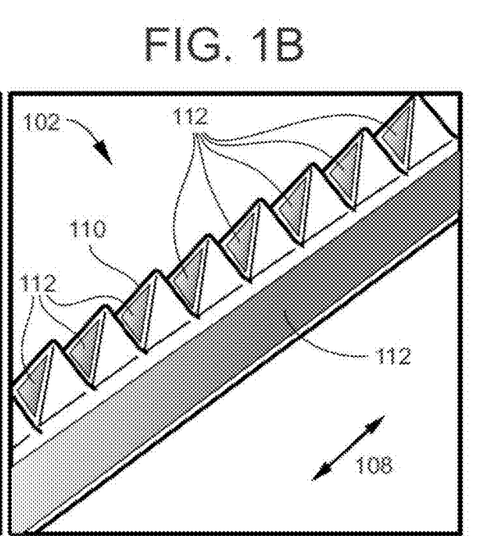
Figure 1C:
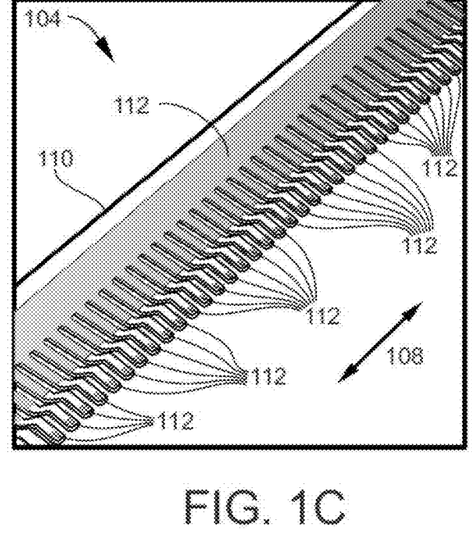
Figure 1D:
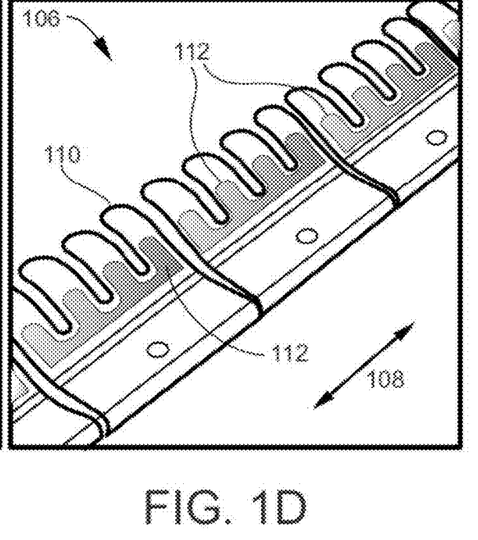

FIG. 1A shows a dome clip type gasket, FIG. 1B shows a twist angle type gasket, and FIGS. 1C and 1D each show a finger clip type gasket. The clips are fairly flexible, so that an application 112 of the RF absorptive material can help to stiffen the non-contact portion of the gasket yet still retain the flexibility at the non-contact portion. By doing this, the applied 112 RF absorptive material can help to promote an improved physical contact between mating surfaces of the gasket with the enclosure junction point.

Figure 2:
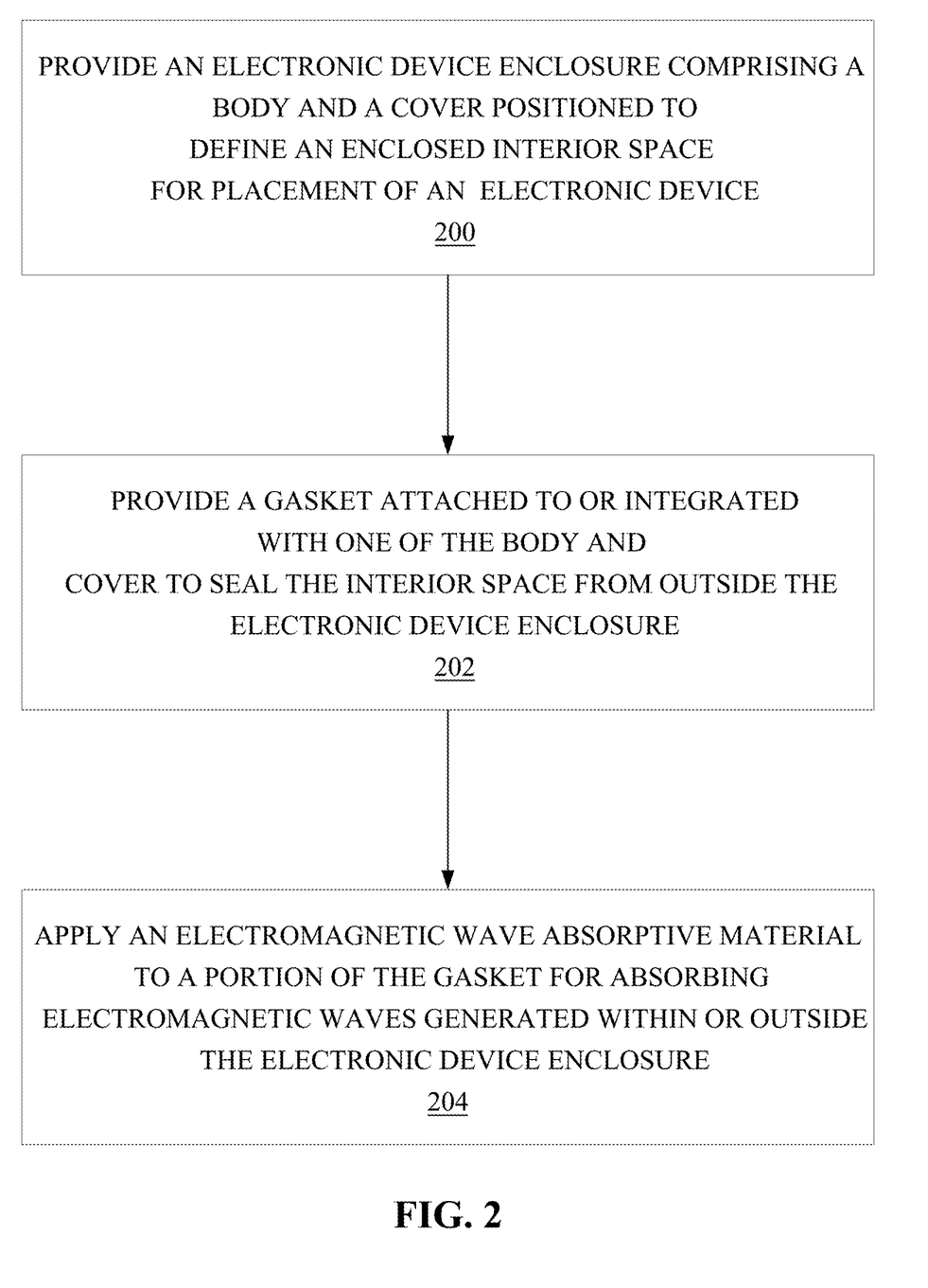
FIG. 2 is a flowchart of an example method for preventing leakage of electromagnetic waves from electronic devices in accordance with embodiments of the present disclosure.

In accordance with embodiments, FIG. 2 illustrates a flowchart of an example method for preventing leakage of electromagnetic waves from electronic devices. The method is described with respect to the example gasket 100 shown in FIG. 1A, although it should be understood that the method may be similarly applied to any other suitable gasket, such as gaskets 102, 104, and 106 shown in FIGS. 1B, 1C, and 1D, respectively. Referring now to FIG. 2, the method includes providing 200 an electronic device enclosure comprising a body and a cover positioned to define an enclosed interior space for placement of an electronic device. The method further includes providing 202 a gasket attached to either the body or cover to seal the interior space from outside the electronic device enclosure. The gasket may be attached to the body or cover in any suitable manner as will be understood to those of skill in the art. As an example, the gasket 100 can be attached such that it positioned at the junction where a cover and housing are positioned together for forming the electronic device enclosure. The method further includes applying 204 an electromagnetic wave absorptive material to a portion of the gasket for absorbing electromagnetic waves generated within or outside of the electronic device enclosure. That is, electromagnetic wave absorptive material (e.g., an RF absorptive material) to a portion of a gasket operably attached to an enclosure junction point on an electronic device.

Still referring to FIG. 1, the electromagnetic wave absorptive material can be applied 112 either to the non-contact portion of an exterior of the gasket, the non-contact portion of an interior of the gasket, or the non-contact portion of both the exterior and interior of the gasket. The non-contact portion of the gasket refers to the portion that does not contact another surface when the cover is contacting the housing to form the enclosure. Application to the exterior of the gasket can provide a benefit of, for example, a 4 dB improvement, while application to the interior alone can provide a benefit of, in an example, a 1-2 dB improvement. Thus, an application 112 of the RF absorptive material on both the interior and exterior can provide an enhanced suppression of RF signals. As such, the method also includes preventing a loss of stray RF signals from the electronic device due to the applied RF absorptive material. Additionally, the method reduces levels external RF signals entering the enclosure, thus improving immunity of the device to external noise sources.

The RF absorptive material can be applied to a gasket in any suitable manner. In an example, the material may be applied to achieve either a substantially even coat or a textured coat. For example, the material may be either smoothly applied or applied such that the surface is textured. The textured application 112 can be done using a splatter coating to create a rougher surface. This rough surface can better absorb leaking RF because there is less reflection to allow RF signals to bounce from as it escapes the enclosure junction point. As such, a splatter coat can help attenuate RF signals at frequencies from 5 GHz to 40 GHz because the surface roughness provides and additional impediment to current flow. In addition, the splatter coating can help with making electrical contacts with metal surfaces of the electronic device. In an example, the splatter coat can be made up of any conductive material with large metal particles embedded within it. In contrast, a smooth application 112 with a thicker coating of RF absorptive material may be advantageous for attenuating RF signals at lower frequencies. Low frequencies may be frequencies at about or below 5 GHz.

The thickness of the electromagnetic wave absorptive material applied to the gasket can be in a range of a few tenths of millimeters or any other suitable thickness. The thickness can be varied depending on the frequency at which one desires to attenuate. In an example, application of a 0.1-0.3 millimeter thickness range of the RF absorptive material can be used to attenuate frequencies in the 2 GHz to 40 GHz range with optimization of the thickness needed to attenuate at the desired frequency. Variations to the thickness can be optimized, in an example, by increments of a few hundredths of a millimeter. Typical application thicknesses can range from 0.05 to 0.5 mm, with the thickest applications providing more benefit for lower frequencies (frequencies below 5 GHz), while the thinnest being beneficial at frequencies above 10 GHz.

The coating of the non-contact areas of the gaskets, as previously described, with the electromagnetic absorptive materials can prevent the RF wave's reflection from or transmission through the gaskets, thereby reducing the potential that these signals may escape from the enclosure junction points. The method disclosed may be easy to implement and cost-efficient since it involves application of an electromagnetic wave absorptive material on gaskets. This can be done either during manufacturing of the gaskets or as an add-on later as desired by a user.

Figure 3A:
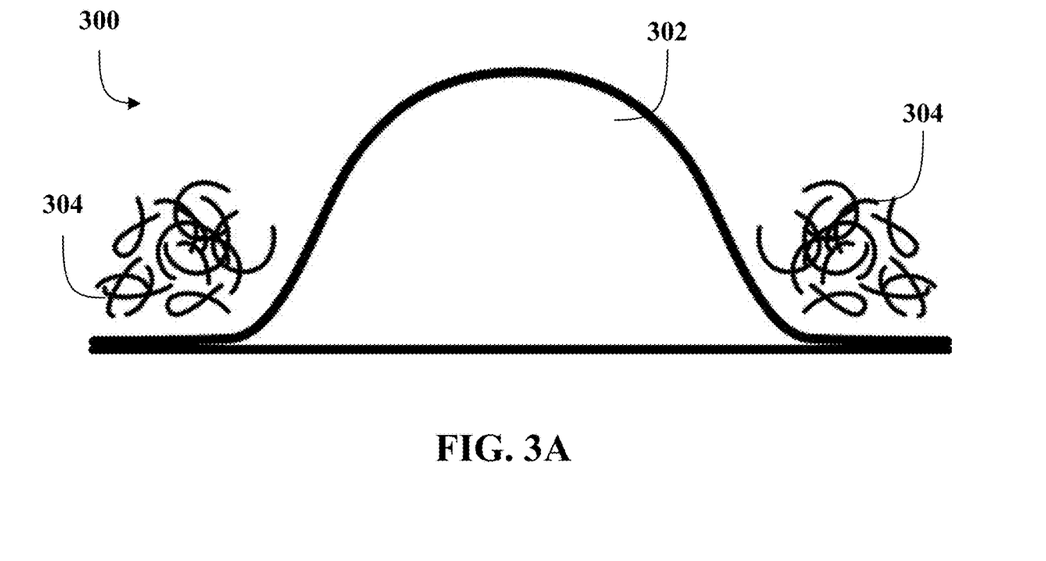
FIGS. 3A and 3B are cross-sectional, side views of an example gasket having electromagnetic wave absorptive material in an uncompressed state and a compressed state, respectively, in accordance with embodiments of the present disclosure.
Figure 3B:
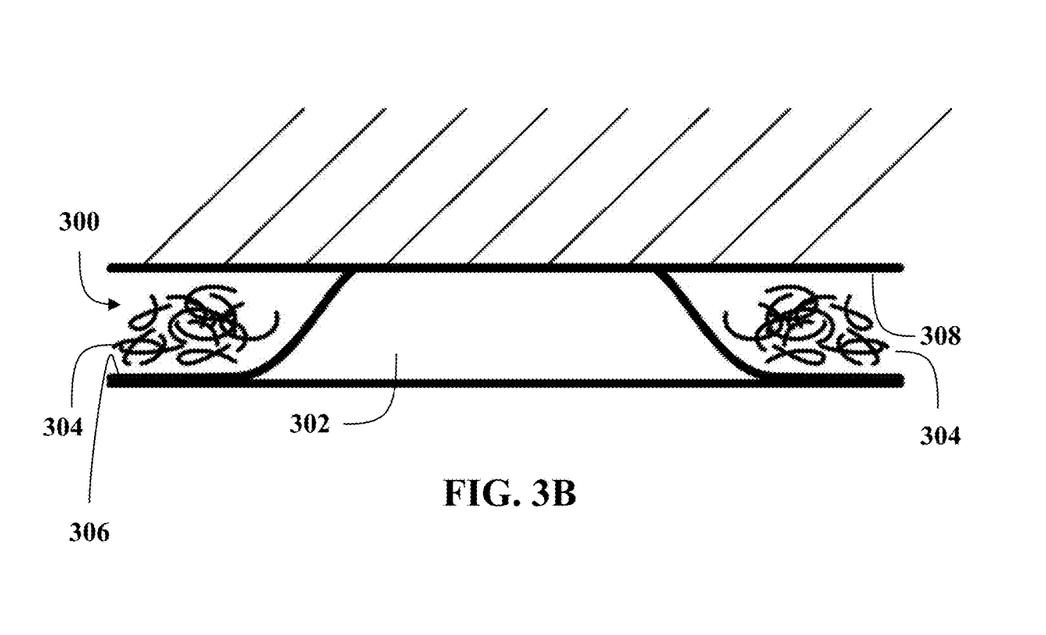

Referring now to FIGS. 3A and 3B, the figures show cross-sectional, side views of an example gasket 300 having electromagnetic wave absorptive material in an uncompressed state and a compressed state, respectively, in accordance with embodiments of the present disclosure. The gasket 300 includes an inner core 302 made of a resilient material such that the gasket 300 can compress as shown in FIG. 3B. Example resilient material includes polyurethane and the like. The gasket 300 may also include an electromagnetic wave absorptive material 304. An example of such electromagnetic wave absorptive material can include a fiber base with carbon threads embedded within it. Continuing this example, the RF absorptive material can be akin to a fabric weave that comprises conductive and RF absorbing threads that result in a predetermined conductivity parameter and a predetermined electromagnetic absorptive parameter.

Referring to FIG. 3B, the compressed gasket 300 is attached to a body 306 of an electronic device enclosure and is compressed by door 308 pushing downwards on the gasket 300. The door 308 and the body 306 can be positioned together as shown in FIG. 3B for defining an interior space for placement of an electronic device. The door 308 and the body may be positioned in close proximity together to form an enclosure. The electromagnetic wave absorptive material 304 can be a smooth or rough weave of integrated fibers.

Figure 4:
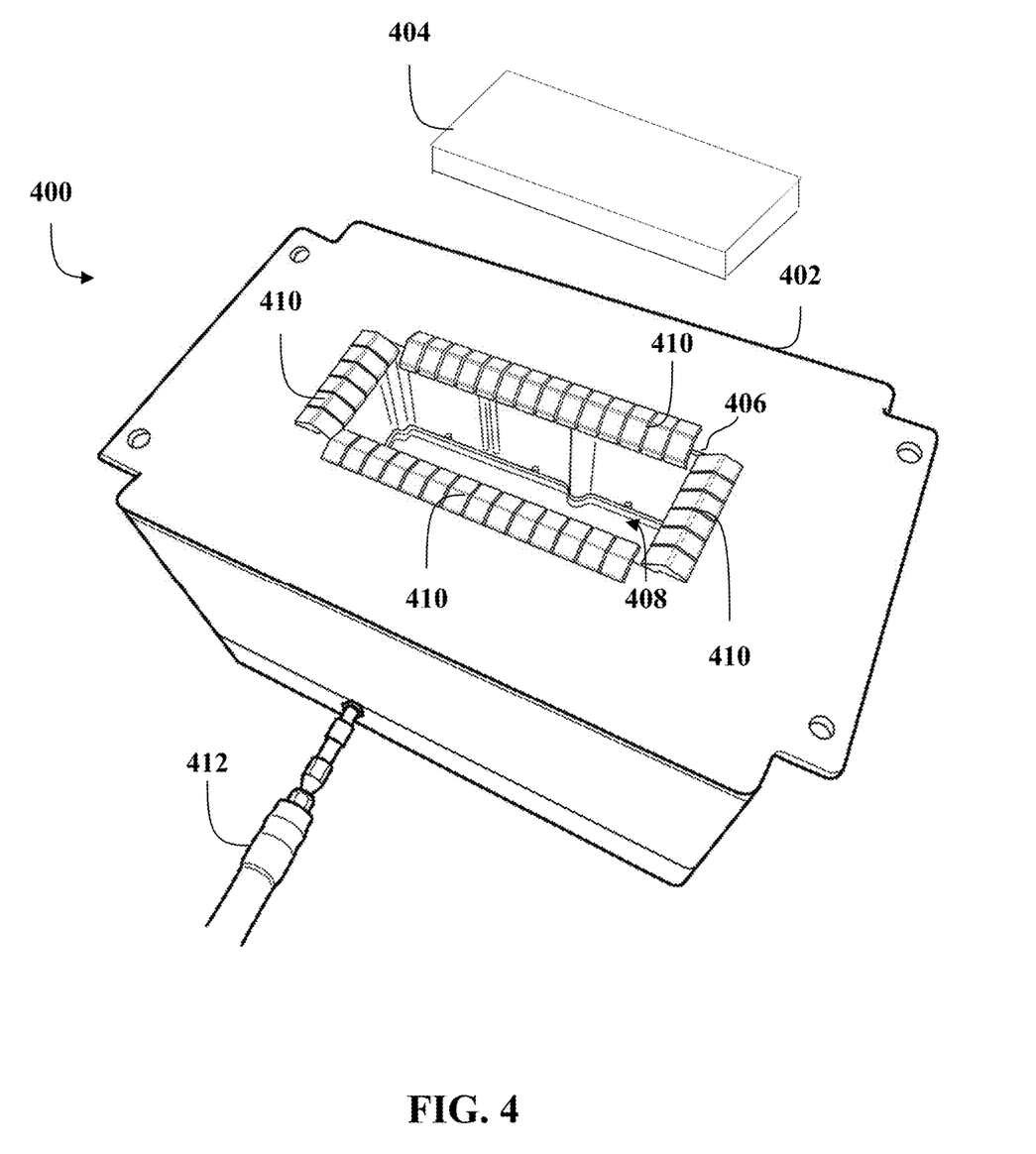
FIG. 4 is a perspective view of an example test fixture to measure the reduction in leakage of electromagnetic waves from an electronic device in accordance with embodiments of the present disclosure.

FIG. 4 illustrates a perspective view of an example system text fixture or system 400 for preventing measuring reduction in leakage of electromagnetic waves from an electronic device in accordance with embodiments of the present disclosure. Referring to FIG. 4, the system 400 includes a body 402 and a cover 404. The cover 404 can be positioned to touch an opening 406 of the body 402 to seal an interior space 408 when touching for placement of an electronic device. Multiple gaskets 410 in accordance with embodiments of the present disclosure are attached to edges of the opening 406.

In the example of FIG. 4, the body 402 is an aluminum box (having dimensions of 10×12×16 centimeters (cm)) with the opening 406 being 4 cm×10 cm. The gaskets 410 are made of beryllium copper (BeCu). The gaskets 410 have an electromagnetic wave absorptive material applied to their surfaces in accordance with embodiments.

Figure 5:
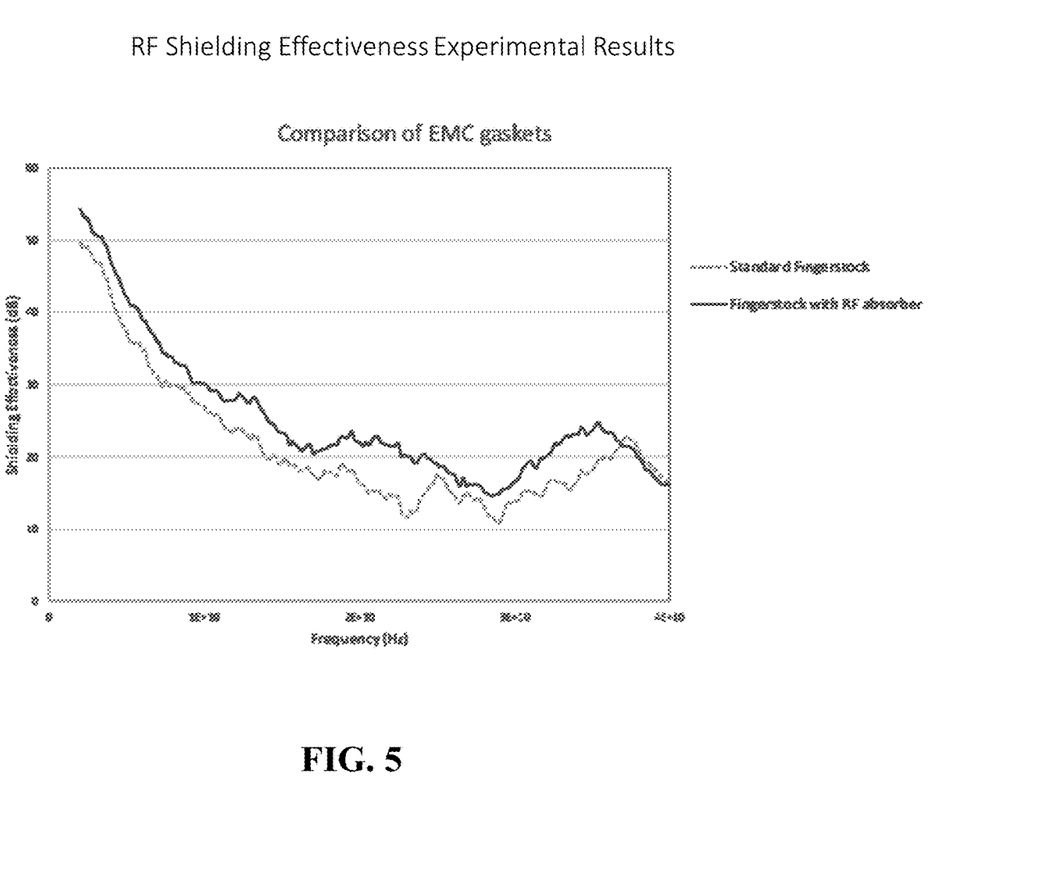
FIG. 5 is a graph depicting experimental test results in accordance with embodiments of the present disclosure.

The system 400 shown in FIG. 4 was used for experimental testing. In an experiment, RF noise was injected into the interior 408 via a cable 412 and a small antenna in the interior 408 while sweeping the frequency from a range of 2 GHz to 40 GHz. The source of the noise was a network analyzer that can send noise into the small antenna located in the interior 408 in order to generate noise within the interior 408. The cover 404, in the experiment, was a metal plate made of aluminum. The cover 404 was compressed downwards with a compression amount of approximately 50% to enable the metal plate to make contact with the gaskets 410 on all sides. RF leakage from the seams, i.e. the enclosure junction points between the cover 404 and body 402, was measured to determine the shielding effectiveness. The experimental results are depicted in the graph shown in FIG. 5, which shows improved results of using a gasket in accordance with embodiments of the present disclosure as compared to a standard gasket using the experimental setup shown in FIG. 4.

Figure 6:
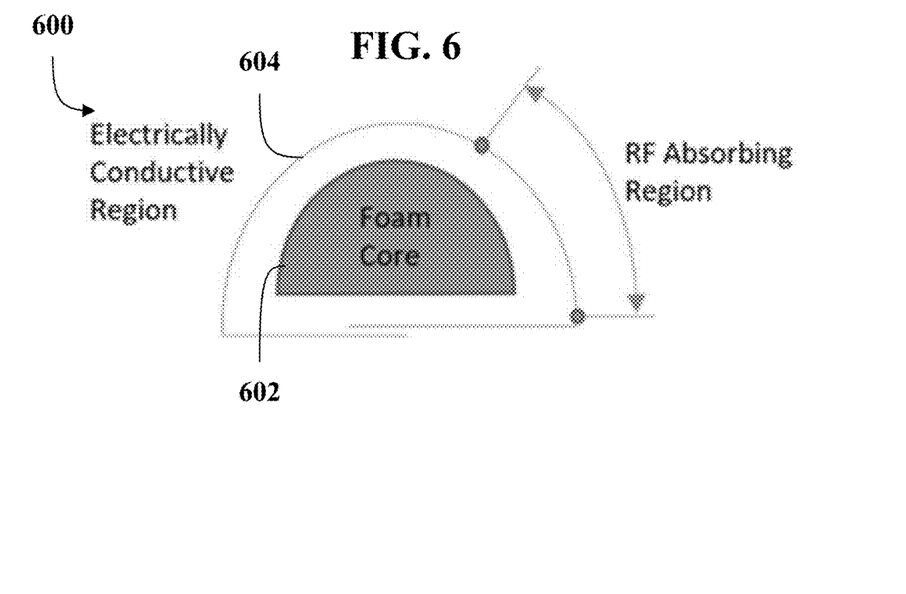
FIG. 6 is a cross-sectional, side view of an example fabric-over-foam gasket having electromagnetic wave absorptive material in accordance with embodiments of the present disclosure.

FIG. 6 is a cross-sectional, side view of an example fabric-over-foam gasket 600 having electromagnetic wave absorptive material in accordance with embodiments of the present disclosure. Referring now to FIG. 6, the gasket 600 includes an inner foam core 602 and an outer fabric weave layer 604. The outer fabric weave layer 604 is made of conductive threads and RF absorptive threads to cover the inner foam core 602. The outer fabric weave layer 604 wraps around and covers the entirety of the foam core 602. In an example, the inner foam core 602 is made of polyurethane, although any suitable material with similar characteristics can be used as the inner foam core 602. The inner foam core 602 can be compressed when the outer fabric weave layer 604 wraps around it in order to make a tight seal. In an example, the weave characteristic for the RF absorbing region can either be a tight weave or a "loose" weave to give a smooth or "fuzzy" texture.

Still referring to FIG. 6, the RF absorptive threads within the outer fabric weave layer 604 are positioned in a non-conductive region when the gasket 600 is operably attached to an enclosure point on an electronic device. The non-conductive region is where the RF absorptive threads are laid to be in contact with, and thus the non-conductive region is also referred to as the RF absorbing region. That is, it is desired that the RF absorbing region is positioned within a region that does not interfere with electrical contacts.

Figure 7:
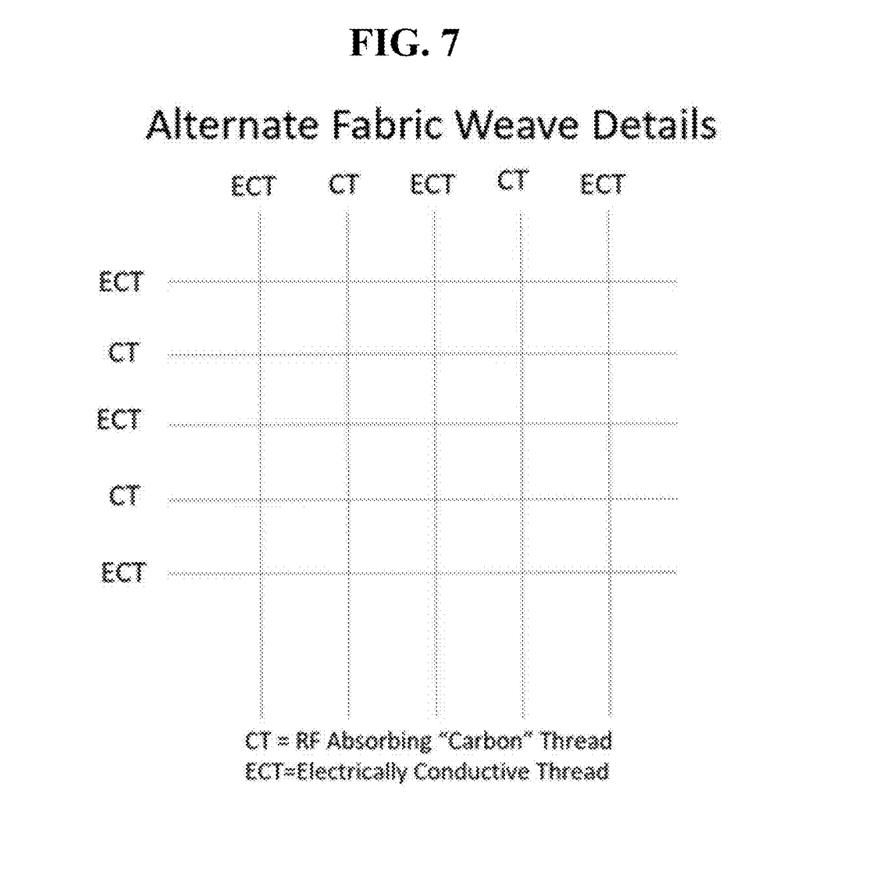
FIG. 7 is diagram showing an example weave characteristic of a fabric-over-foam gasket in accordance with embodiments of the present disclosure.

FIG. 7 is diagram showing an example weave characteristic of a fabric-over-foam gasket in accordance with embodiments of the present disclosure. Referring to FIG. 7, in this example, there are alternating conductive threads and RF absorptive threads. This material can be the outer fabric weave layer 604 shown in FIG. 6. This depiction shows an outer fabric weave layer with an alternate weave characteristic wherein the conductive thread alternates with the RF absorptive threads in a 1:1 ratio in a grid-like manner to create a fabric mesh. In an example, the RF absorptive thread can comprise a fiber base with carbon threads embedded within it, although any suitable element that absorbs RF can also be used, depending on the frequency at which one desires to attenuate at. This alternate weave characteristic is but one possible embodiment since the ratio of the conductive threads to the RF absorptive threads can be varied to adjust the conductivity and/or RF absorptive characteristics. That is, the layout and configuration of the conductive threads and RF absorptive threads can be adjusted to achieve a predetermined conductivity parameter and a predetermined RF absorptive parameter, depending on the frequency at which one desires to attenuate at. As such, the alternating ratio for the outer fabric weave layer can be in a 1:1 ratio of conductive threads to RF absorptive threads or in another ratio as so desired.

The disclosure described herein can be used for electronic devices, computing devices, a computer chassis, and/or any other suitable device or equipment that has a plurality of conductive surfaces that can operably mate at a seam or enclosure junction point whereby there is a need to either prevent internal RF signals from escaping, or prevent external RF signals from entering. As such the disclosure described herein can have applications in telecommunications, computer systems, power systems, the military, aviation, radio, and any other such fields whereby there is a need to prevent RF signals from escaping or entering at the seams or enclosure joint points of a device or equipment.

Aspects of the present subject matter are described herein with reference to flowchart illustrations and/or block diagrams of methods, apparatus (systems), and computer program products according to embodiments of the subject matter. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present subject matter. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the embodiments have been described in connection with the various embodiments of the various figures, it is to be understood that other similar embodiments may be used or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed:

1. A system comprising:
   a body and a cover positioned to define an enclosed interior space for placement of an electronic device;
   a gasket attached to or integrated with one of the body and cover to seal the interior space from outside the electronic device enclosure, wherein the gasket is a clip type gasket having a flexible, non-contact portion; and
   an electromagnetic wave absorptive material attached to a surface of the flexible, non-contact portion of the clip type gasket for absorbing electromagnetic waves generated within or outside of the electronic device enclosure.

2. The system of claim 1, wherein the electromagnetic wave absorptive material absorbs electromagnetic waves having a frequency within a radio frequency (RF) range.

3. The system of claim 1, wherein the electromagnetic wave absorptive material comprises one of a carbon impregnated foam, an epoxy loaded with carbon, and a polymer resin with a metal flake filler.

4. The system of claim 1, wherein the clip type gasket comprises one of a dome clip, a finger clip, and a finger stock.

5. The system of claim 1, wherein the clip type gasket comprises one of beryllium copper and stainless steel.

6. The system of claim 1, wherein the electromagnetic wave absorptive material is applied to the flexible, non-contact portion of one of an exterior of the clip type gasket, an interior of the clip type gasket, and both the exterior and interior of the clip type gasket.

7. The system of claim 1, wherein the electromagnetic wave absorptive material is applied as one of a substantially even coat and a textured coat to the flexible, non-contact portion of the clip type gasket.

8. The system of claim 1, wherein the electromagnetic wave absorptive material is electrically insulating.

9. A clip-type gasket having a flexible non-contact portion comprising:
   an inner core made of a resilient material; and
   a fabric comprising electromagnetic wave absorptive material and substantially covering the inner core, wherein the electromagnetic wave absorptive material is electrically insulating and attached to a surface of the flexible non-contact clip-type gasket for absorbing electromagnetic waves generated within or outside of an electronic device enclosure,
   wherein the electromagnetic wave absorptive material comprises a fiber weave that contains a plurality of conductive threads and RF absorptive threads embedded therein.

10. The gasket of claim 9, wherein the fabric comprises a predetermined configuration of alternating conductive threads and electromagnetic wave absorptive threads to result in a predetermined conductivity parameter and a predetermined electromagnetic absorptive parameter.

11. The gasket of claim 9, wherein the resilient material comprises polyurethane.

12. The gasket of claim 9, wherein the electromagnetic wave absorptive material comprises one of a carbon impregnated foam, an epoxy loaded with carbon, and a polymer resin with a metal flake filler.

13. The gasket of claim 9, wherein the electromagnetic wave absorptive material is electrically insulating.

14. The gasket of claim 9, wherein a substantially even coat and a textured coat of the electromagnetic wave absorptive material is applied to the portion of the gasket.

15. The gasket of claim 9, wherein the gasket comprises one of beryllium copper and stainless steel.

16. The gasket of claim 9, wherein the electromagnetic wave absorptive material absorbs electromagnetic waves having a frequency within a radio frequency (RF) range.

* * * * *